United States Patent
Halamik et al.

(10) Patent No.: US 6,633,193 B1
(45) Date of Patent: Oct. 14, 2003

(54) METHOD OF FORMING A SWITCHING DEVICE AND STRUCTURE THEREFOR

(75) Inventors: Josef Halamik, Roznov P. R. (CZ); Frantisek Sukup, Roznov P. R. (CZ)

(73) Assignee: Wells Fargo Bank Minnesota, National Association, as Collateral Agent, Middletown, CT (US)

( * ) Notice: Subject to any disclaimer, the term of this patent is extended or adjusted under 35 U.S.C. 154(b) by 46 days.

(21) Appl. No.: 10/117,209

(22) Filed: Apr. 8, 2002

(51) Int. Cl.[7] .............................. H03K 5/08; H03K 4/06
(52) U.S. Cl. ...................... 327/334; 327/321; 327/140; 327/365
(58) Field of Search .................. 327/131, 132, 327/134, 137, 140, 170, 334, 336, 309, 318, 321, 365, 427, 434

(56) References Cited

U.S. PATENT DOCUMENTS

| | | | |
|---|---|---|---|
| 4,789,837 A | * 12/1988 | Ridgers | 327/334 |
| 4,996,498 A | * 2/1991 | Hanna | 327/362 |
| 5,327,027 A | * 7/1994 | Taylor | 327/336 |
| 5,585,752 A | 12/1996 | Botti et al. | |
| 5,726,599 A | * 3/1998 | Genest | 327/553 |
| 5,900,771 A | 5/1999 | Bremner | |
| 6,040,730 A | * 3/2000 | Ferrario | 327/344 |
| 6,344,772 B1 | 2/2002 | Larsson | |

* cited by examiner

*Primary Examiner*—Toan Tran

(57) ABSTRACT

A switching device (20) is formed to generate a ramp voltage by using a capacitor (48) formed on the semiconductor die (90) with the switching device (20). The switching device (20) drives a high-power device to conduct load currents for a load. The ramp voltage is used to gradually increase the drive that is applied to the high-power device in order to gradually increase the current conducted by the high-power device.

20 Claims, 4 Drawing Sheets

METHOD OF FORMING A SWITCHING DEVICE AND STRUCTURE THEREFOR

BACKGROUND OF THE INVENTION

The present invention relates, in general, to electronics, and more particularly, to semiconductor switching circuits.

In the past, the electronics industry utilized various design techniques to build switching circuits and particularly to form high-power switching circuits. These high-power switching circuits often utilize a power transistor that is alternately switched on and off to provide power to an inductive load. One example of such high-power switching circuits is a switching power supply, often referred to as a switch mode power supply (SMPS). A switch mode power supply typically utilizes an integrated circuit to drive external power transistors that are connected to the inductive load. During an initial power on sequencing or after recovering from an error condition or overload mode, the integrated circuit generally delivers maximum power to the load in order to generate the desired power supply voltage. The voltage at the load often overshoots the desired value before the integrated circuit can effectively reduce the drive to the power transistors. During this transition time, the power transistors must sustain large current flows which can overheat and damage the power transistors. Typically other circuits are connected to a secondary side of the inductive load. These other circuits can also be damaged by the large currents. Often, resistors and capacitors are connected as a delay network to slow the rate at which the switching signals are applied to the power transistors thereby slowing the rate at which the load is charged to the desired voltage value.

One problem with these capacitors and resistors is the physical size and values of the resistors and capacitors used to provide the delay. Typically, the circuit delays over a time period of one to fifteen milliseconds. Providing such a long time delay typically requires capacitor values that range from one to one thousand nanofarads. Such large capacitor values typically are difficult to integrate onto a semiconductor die because such values consume a very large amount of semiconductor die area.

Accordingly, it is desirable to have a method of forming a switching device that does not utilize large value capacitors, and that can be integrated onto a semiconductor die.

For simplicity and clarity of illustration, elements in the figures are not necessarily to scale, and the same reference numbers in different figures denote the same elements. Additionally, descriptions and details of well known elements, steps, flows, and other features are omitted for simplicity of the description.

DETAILED DESCRIPTION OF THE DRAWINGS

The present invention includes a method of forming a switching device that facilitates gradually enabling a high-power device, for example a power transistor, to conduct load current subsequent to the high-power device being disabled for a period of time. The switching device includes circuits that function to provide the gradual enabling and all are formed on the same semiconductor die. Gradually enabling the high-power device facilitates protecting the high-power device and other circuitry connected to the high-power device including circuits connected to secondary sides of inductive loads that are driven by the high-power device.

Figure 1:
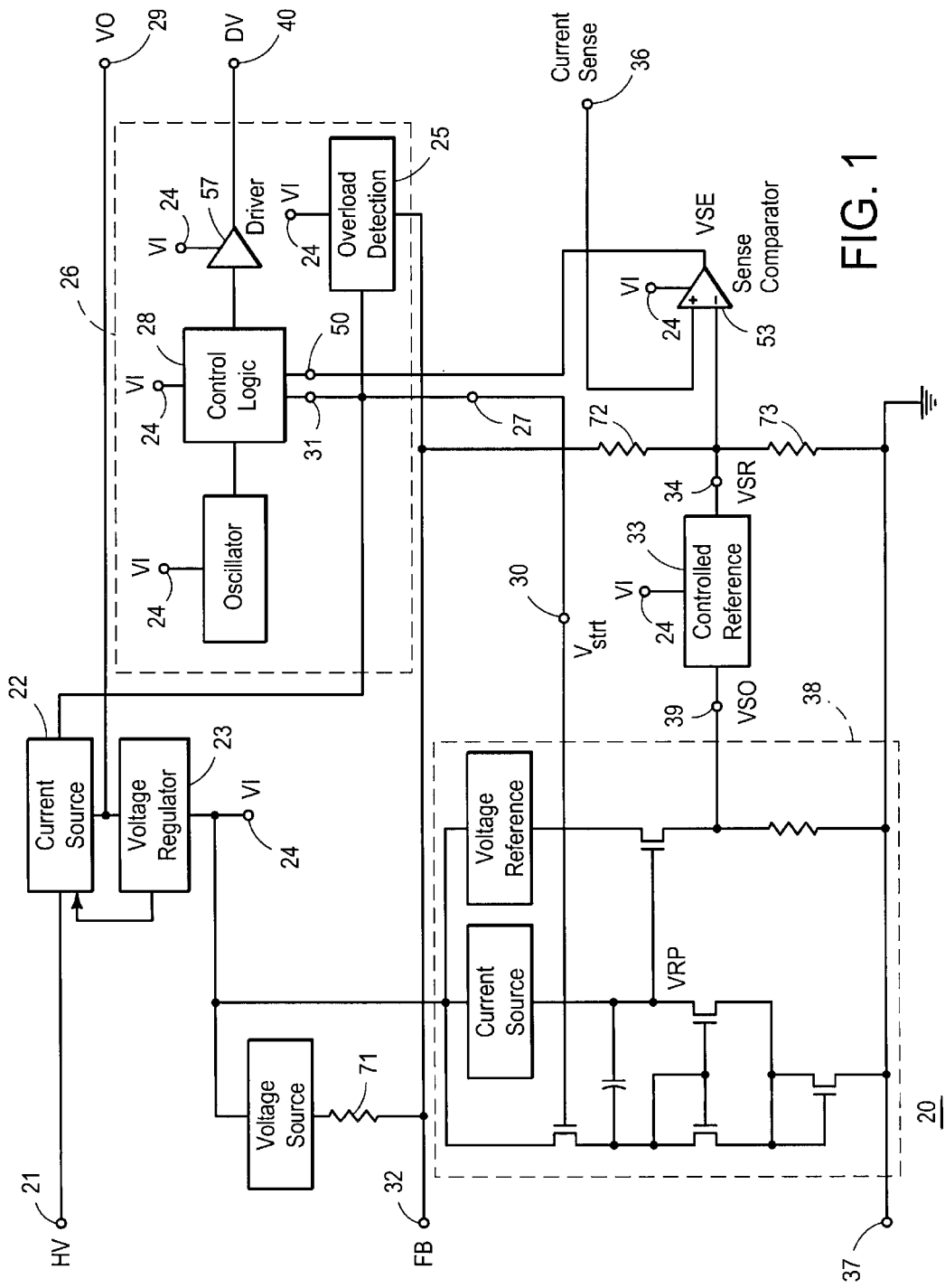
FIG. 1 schematically illustrates a block diagram of a portion of an embodiment of a switching device in accordance with the present invention.

FIG. 1 schematically illustrates a block diagram of a portion of an embodiment of a switching device 20 that includes a soft-start circuit 38, illustrated generally by a dashed box, formed on a semiconductor die with device 20. For clarity and simplicity of the description, the block diagram illustrates device 20 in an embodiment of a switch mode power supply. However, the description is applicable to other switching device embodiments including pulse width modulated controllers, DC—DC Converters, and other switching pulse systems.

Device 20 includes a power source or high voltage (HV) input 21. Input 21 typically is connected to a power source that has a higher voltage value than the desired value of an output voltage (VO) on a voltage output 29. Device 20 also has a power return 37 that typically is connected to a common return or preferably to ground. A current source 22 and a voltage regulator 23 are connected to input 21 and function together to provide an internal voltage (VI) on an internal voltage node 24. Internal voltage (VI) supplies power to operate portions of device 20. Current source 22 and voltage regulator 23 also generate the output voltage (VO) and are connected to supply the output voltage on voltage output 29. In the preferred embodiment, voltage regulator 23 is a drain-voltage based regulator. In some embodiments, internal voltage node 24 may be the same node and voltage value as voltage output 29.

A timing/control block 26, illustrated generally by a dashed box, is formed to generate a series of timing pulses that are applied through a driver output (DVR) 40. Output 40 typically is connected to the input of a high-power device (not shown) such as a power MOSFET that supplies load current to a load such as a primary winding of a transformer circuit (also not shown). Such high-power devices and loads are well know to those skilled in the art. In some embodiments, the high-power device may be formed on the same semiconductor die as device 20. In such an embodiment, input 21 may be connected to the output side of the high-power device and input 21 may receive a pulsed input waveform that has a maximum amplitude that is larger than the output voltage (VO) on output 29.

Timing/control block 26 typically includes an oscillator that generates timing pulses at a desired frequency. The oscillator is connected to apply the timing pulses to a control logic block 28. In some embodiments, the oscillator may be replaced by a pulse signal synchronized with external circuits and applied to an input (not shown) of device 20. Control logic block 28 controls the time at which the timing pulses are applied to an input of an output driver 57 through a cooperative connection therebetween. Driver 57 applies the timing pulses to output 40 via a connection thereto. Control logic block 28 has a reset input 31 that is used to stop the timing pulses when an overload or other error conditions occur, or when output 40 is to shut down. An overload detection circuit 25 is connected to detect an overload condition or overload mode on output 29 such as current through the high-power device exceeding a selected value that might damage the high-power device or external circuitry coupled thereto. Circuit 25 also is connected to detect an overload mode or condition on the secondary side of any inductive load that is driven by the high-power device. Overload conditions in the secondary circuits are detected through a connection to a feedback input 32 and through a connection to the output voltage through current source 22. Under such overload conditions, overload detection circuit 25 resets control logic block 28 to cease transferring the timing pulses to driver 57. When circuit 25 removes the reset signal from input 31, control logic block 28 again starts supplying timing pulses to output 40. This is commonly referred to as a recovery from an overload mode.

Rapidly restarting the high-power device to conduct the full load current required by the load would result is stressing the high-power device and causing damage to both the high-power device and to other devices that are connected to the load. As will be seen hereinafter, soft-start circuit 38 facilitates forming a gradual start-up or a soft-start whenever power is first applied to device 20 and during a recovery from an overload mode in order to minimize such damage or system stress. Soft-start circuit 38 is formed to generate a gradually varying soft-start voltage (VSO) that facilitates gradually increasing the width of the timing pulses or alternately the period of time that the timing pulses are applied to output 40 when restarting from an overload mode or other similar condition. As a result, the current conducted by the high-power device (not shown) gradually increases from a low value to a value required to support the normal operational current demanded by the load thereby minimizing stresses and damage. Soft-start circuit 38 is formed to receive the reset signal from overload detection circuit 25 on a soft-start input 30 via a cooperative connection to an output 27 of overload detection circuit 25. Soft-start circuit 38 is also formed to responsively generate a soft-start voltage (VSO) on a soft-start output 39. During a soft-start time period or soft-start period, the soft-start voltage (VSO) gradually increases from a first value to a second value that is selected to provide desired operational characteristics.

The soft-start voltage (VSO) on soft-start output 39 is applied to an input of a controlled reference 33. Controlled reference 33 is formed to generate a sense reference voltage (VSR) on a sense reference output 34. In the preferred embodiment, the sense reference voltage (VSR) approximately duplicates the value and shape of the voltage applied to the input of controlled reference 33. In other embodiments, the value of the sense reference voltage (VSR) may be different but the waveform generally follows the waveform of the soft-start output voltage (VSO).

Feedback input 32 and a current sense input 36 of device 20 assist in forming a sense enable voltage (VSE) at an output of a sense comparator 53. Current sense input 36 typically is connected to sense the current flowing through the high-power device (not shown). The voltage on current sense input 36 is applied to a positive input of comparator 53 and the sense reference voltage (VSR) is applied to the negative input of comparator 53. The voltage on current sense input 36 is compared to the sense reference voltage (VSR) by sense comparator 53. The output of comparator 53 is applied to an enable input 50 of control logic block 28 and is used to set the width of the timing pulses that are applied to the high-power device by driver output 40. In the preferred embodiment, the sense reference voltage (VSR) applied to the negative input of comparator 53 is derived from soft-start circuit 38, controlled reference 33, and feedback input 32. The voltage applied to feedback input 32 typically is based on the amount of current required by the load. The value of the feedback voltage at feedback input 32 is applied through a resistor divider of resistors 71, 72, and 73 to the negative input of sense comparator 53. In the preferred embodiment, this value is added to the sense reference voltage (VSR) generated by soft-start circuit 38 or controlled reference 33 to form the varying reference voltage applied to the negative input of sense comparator 53. In some embodiments reference 33 and resistors 72 and 73 may be omitted. In other embodiments, the gradually varying sense reference voltage (VSR) generated by soft-start circuit 38 and controlled reference 33 may be directly applied elsewhere. During the soft-start time period, the value of the sense reference voltage (VSR) at sense reference output 34 of controlled reference 33 gradually varies, responsively to the soft-start voltage (VSO), from a small value to a larger value and the corresponding value applied to the negative input of comparator 53 similarly varies. Thus, gradually increasing the soft-start voltage (VSO) during the soft-start period also gradually increases the value of the sense reference voltage (VSE) and causes the width of each pulse or alternately the number of pulses applied to output 40 to responsively increase gradually. At the end of the soft-start period, the soft-start voltage remains at an approximately constant operating value to allow device 20 to operate in a normal operating mode.

Figure 2:
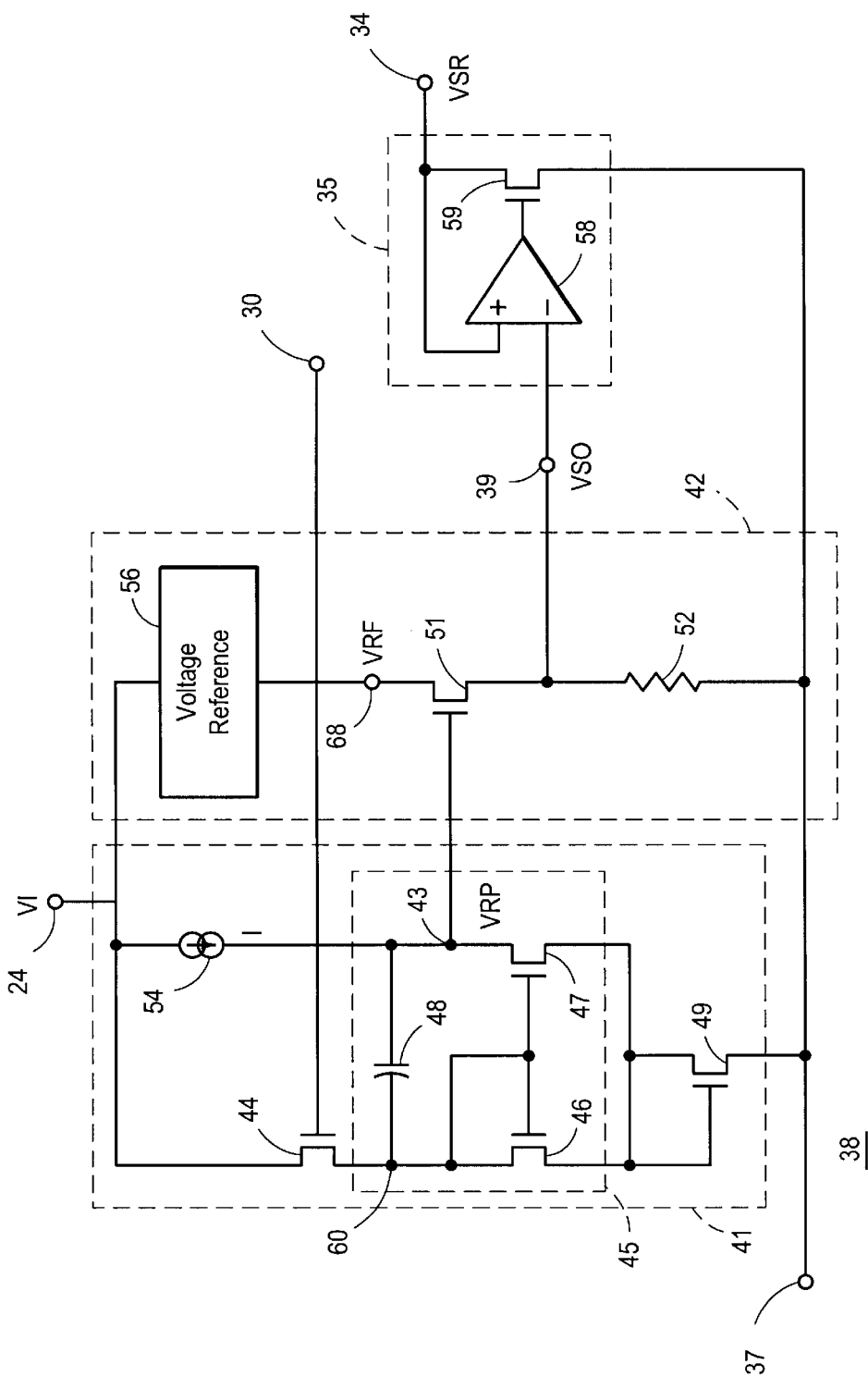
FIG. 2 schematically illustrates an embodiment of a portion of a soft-start circuit that is a portion of the switching device of FIG. 1 in accordance with the present invention.

FIG. 2 schematically illustrates an embodiment of soft-start circuit 38 illustrated in FIG. 1. Soft-start circuit 38 is formed to include a timing section 41 and an isolation section 42, both of which are generally illustrated by dashed boxes. Timing section 41 is formed to generate, responsively to the reset signal on input 30, a ramp voltage (VRP) at a ramp node 43. As will be seen in more detail hereinafter, the ramp voltage (VRP) gradually varies from a first value to a second value during the soft-start period, and typically continues varying to a larger value after the soft-start period. Isolation section 42 is formed to cooperatively respond to the ramp voltage and to responsively generate the soft-start voltage (VSO) and the soft-start time period at output 39, and to copy the value of an accurately controlled reference voltage (VRF) to the soft-start voltage at the time when the soft-start time period elapses.

Timing section 41 includes a capacitor multiplier circuit 45, illustrated generally by a dashed box, that increases the effective value of a capacitor 48 to advantageously facilitate forming capacitor 48 on a semiconductor die with timing section 41. Capacitor multiplier circuit 45 has a first branch that includes first transistor 47 having a first current carrying electrode connected to both a first terminal of capacitor 48 and to ramp node 43. A second branch of capacitor multiplier circuit 45 has a first current carrying electrode of a second transistor 46 connected to a second terminal of capacitor 48 at a node 60, to a control electrode of second transistor 46, and to a control electrode of first transistor 47. A constant current source 54 of timing section 41 is connected in series between internal voltage node 24 and the first branch of capacitor multiplier circuit 45. Constant current source 54 has a first terminal connected to internal voltage node 24 and a second terminal connected to the first current carrying electrode of first transistor 47. Source 54 is formed to supply a constant current (I) that is used for charging capacitor 48.

A switch transistor 44 is coupled in series between internal voltage node 24 and the second branch of capacitor multiplier circuit 45. Switch transistor 44 has a first current carrying electrode connected to internal voltage node 24 and a second current carrying electrode connected to the first current carrying electrode of second transistor 46. A control electrode of switch transistor 44 is responsively connected to start input 30. As will be seen hereinafter in the description of FIG. 3, an optional adjust transistor 49 is connected between capacitor multiplier circuit 45 and return 37. Transistor 49 has a first current carrying electrode and a control electrode connected to the second current carrying electrodes of both transistors 46 and 47, and has a second current carrying electrode connected to return 37.

Isolation section 42 includes a voltage reference 56 and an isolation transistor 51. Voltage reference 56 is connected in series between transistor 51 and internal voltage node 24. Voltage reference 56 has an input connected to node 24 and an output 68 connected to a first current carrying electrode of isolation transistor 51 via connections to output 68. Voltage reference 56 is formed to generate an accurately controlled reference voltage (VRF) that is used to develop the reference value for comparator 53 (FIG. 1). When the soft-start time period elapses, the value of the reference voltage (VRF) is copied to output 39 for use during normal operation of device 20. Thus, it is desirable for voltage reference 56 to be very accurate. In the preferred embodiment, reference 56 has an error of less than plus or minus five percent (5%). A second current carrying electrode of isolation transistor 51 is connected to soft-start output 39 and to the first terminal of a resistor 52. A second terminal of resistor 52 is connected to power return 37.

Figure 3:
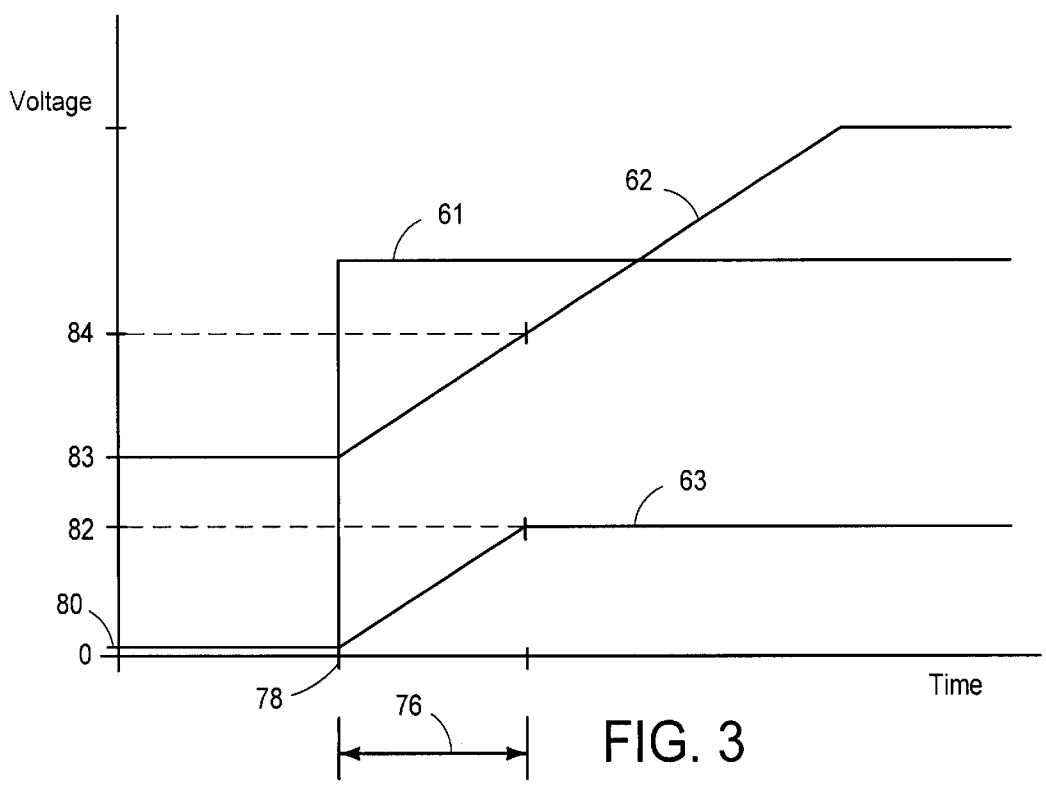
FIG. 3 is a graph having plots graphically illustrating waveforms in various points of the switching device in accordance with the present invention.
Figure 4:
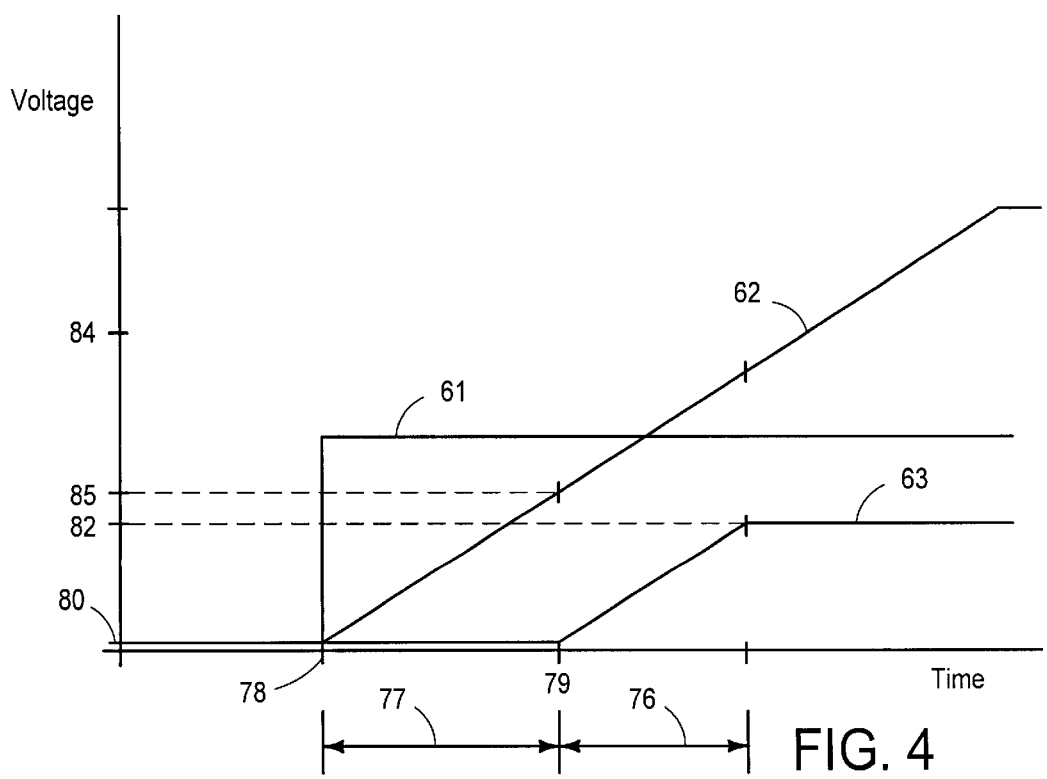
FIG. 4 is a another graph having plots graphically illustrating waveforms in various points of the switching device in accordance with the present invention.

FIG. 3 and FIG. 4 are graphs having plots graphically illustrating waveforms in various points of switching device 20. FIG. 3 illustrates waveforms of the preferred embodiment that includes transistor 49. FIG. 4 illustrates the waveforms of an embodiment that omits transistor 49. For both FIG. 3 and FIG. 4, the abscissa illustrates increasing time values and the ordinate indicates increasing voltage values. A plot 61 illustrates the reset signal applied to input 30, a plot 62 illustrates the ramp voltage (VRP) at node 43, and a plot 63 illustrates the soft-start voltage (VSO) at output 39. A voltage value 80 represent a value approximately equal to that on return 37, a voltage value 83 represents a value that is approximately the value of the voltage on return 37 plus the threshold voltage (VTO) of transistor 49, a voltage value 82 represents a value of the reference voltage (VRF) on output 68, and a voltage value 84 represents a value that is approximately the value of the reference voltage (VRF) on output 68 plus the threshold voltage (VTO) of transistor 49.

For clarity, the following operational description refers to both FIG. 2 and FIG. 3. Referring to plot 61, prior to a time 78 the reset signal is at voltage value 80 and transistor 44 is turned-on. Thus, capacitor 48 is discharged and node 60 is at a low voltage value that is approximately the value of the voltage on return 37 plus the voltage dropped across transistor 46. Node 43 is at voltage value 83 as illustrated by plot 62. The threshold voltage of transistor 51 is preferably matched to that of transistor 49, thus, voltage value 83 on node 43 turns-off transistor 51. Consequently, the soft-start voltage (VSO) on output 39 is at voltage value 80 as illustrated by plot 63.

At time 78, the reset signal is released and goes to a higher voltage that turns-off transistor 44. Current source 54 responsively begins supplying current to charge capacitor 48 through the control electrode of transistors 46 and 47. Because a very small current flows through the control electrodes, the charging current is limited, thus, capacitor 48 charges slowly. Referring to plot 62, the charging of capacitor 48 generates a ramp voltage waveform at node 43. The ramp shape results from charging capacitor 48 with a constant current source. It should be noted that other waveform shapes may be formed by different charging circuits. At time 78, the ramp voltage (VRP) at node 43 begins at a first voltage value that is approximately equal to value 83 and increases as capacitor 48 is charged. In the preferred embodiment, adjust transistor 49 shifts the ramp voltage value at node 43 to compensate for the threshold voltage of transistors 49 and 51, thus, transistor 51 responsively begins conducting as the ramp voltage begins increasing at time 78 as illustrated by plot 63. Accordingly, it is preferable to match the threshold characteristics of transistors 49 and 51. Because of the matching and because transistor 51 is connected in a voltage follower configuration, transistor 51 is enabled to conduct approximately at time 78 (minus transistor delays) and the soft-start voltage (VSO) on output 39 begins at a third value that is approximately equal to value 80 at time 78 and increases as illustrated by plot 63. During time period 76, transistor 51 increases the voltage applied on output 39, responsively to the ramp voltage on node 43, from the third value to a fourth value that is approximately equal to value 82. Since transistor 51 is connected in an emitter follower configuration, the waveform of the soft-start voltage (VSO) at output 39 during time period 76 responsively follows the waveform and the slope of the ramp voltage (VRP) at node 43. When the value of the ramp voltage reaches a second value approximately equal to value 84, transistor 51 is completely enabled and couples approximately the value of the reference voltage (VRF) from output 68 to output 39 (minus an internal drop across transistor 51). As capacitor 48 continues charging after time period 76 and the ramp voltage value (VRP) at node 43 increases to a higher value past voltage value 84, transistor 51 no longer increases the value on output 39 and decouples or isolates output 39 from the further ramp voltage increases, thus, output 39 remains at fourth voltage value 82. Referring briefly back to FIG. 1 and FIG. 3, the soft-start voltage (VSO) is utilized, via reference 33 and comparator 53, to enable input 50 of control logic block 28 to gradually increase the width of the pulses or alternately the number of the pulses applied to output 40 until reaching normal operation at the end of the time period 76. Thus, the soft-start period begins at time 78 when the soft-start voltage begins increasing and ends at the end of period 76 when transistor 51 decouples output 39 from the effects of the ramp voltage on node 43, and device 20 returns to normal operation after recovering from the overload condition. It is also noted that this soft-start sequence also occurs at an initial start-up of device 20.

The following description refers to FIGS. 2 and 4. In embodiments without transistor 49, there is a time delay between the time that the ramp voltage (VRP) begins increasing and the time that the soft-start voltage (VSO) begins increasing. In such an embodiment, the soft-start voltage (VSO) on output 39 does not begin increasing until the ramp voltage (VRP) reaches the threshold voltage of transistor 51 represented approximately at value 85. This delays the increase of the soft-start voltage in time relative to the ramp voltage (VRP) by a time period 77. Thus, the soft-start voltage has the same waveshape as the ramp voltage and increases to the same value as the soft-start voltage in the description of FIG. 3 and has the same rise time during time period 76, however, time period 76 is delayed and does not begin until after a delay time period 77.

Without transistor 49, the ramp voltage at node 43 has a low value that is approximately value 80 (plot 62). At time 78 the ramp voltage begins to increase. However the voltage at node 43 has to reach the threshold voltage of transistor 51 before the soft-start voltage begins increasing. At time 79 the ramp voltage reaches the threshold value at value 85 and transistor 51 is enabled and begins conducting to increase the soft-start voltage. As in the discussion of FIG. 3, transistor 51 is enabled to increase the soft-start voltage until output 39 reaches the reference voltage value (VRF) on output 68. At that value, transistor 51 decouples the soft-start output and the soft-start voltage from the ramp voltage and from node 43 including variations therein. As illustrated in plot 63 of FIG. 4, the soft-start time period has the same duration (illustrated by period 76), however, it is delayed in time by the time required for node 43 to reach the threshold voltage of transistor 51.

Referring again to FIG. 2, in the preferred embodiment the soft-start voltage (VSO) on output 39 is applied to the input of a controlled reference 35, illustrated generally by a dashed box, that is configured as an active clamp or zener clamp. In this preferred embodiment, the active clamp has a unity gain and is formed as an operational amplifier 58 and a clamp transistor 59. Transistor 59 has a first current carrying electrode connected to a positive input of operational amplifier 58 and to a sense reference output 34, a second current carrying electrode connected to power return 37, and a control electrode connected to an output of operational amplifier 58. The negative input of operational amplifier 58 is connected to receive the soft-start voltage (VSO) on output 39. Because the positive input of amplifier is connected to the first current carrying electrode of transistor 59, output 34 of the active clamp is forced to follow the same waveform that is applied to the input and produces a voltage value that is equal to the input voltage times the gain of amplifier 58. In this preferred embodiment, the gain of amplifier 58 is approximately one, thus, the voltage on output 34 is approximately equal to the waveform and the value of the soft-start voltage (VSO) on soft-start output 39. Consequently, the sense reference voltage (VSR) on output 34 increases from the first value 80 at time 78 to the second value 82 during the first time period 76. In other embodiments, amplifier 58 may have a smaller or larger gain to produce a correspondingly smaller or larger voltage value.

Referring still to FIG. 2, transistors 46 and 47 function together to effectively multiply the value of capacitor 48 and facilitate forming a large time period from a small capacitor value thereby facilitating forming capacitor 48 on a semi-conductor die as a portion of section 41. The value of the current (I) supplied by current source 54, the value of capacitor 48, and the gains of transistors 46 and 47 are chosen to provide the desired soft-start time period. The soft-start time period (TSS) can be approximately determined according to the equation:

$$TSS = [((G46)/(G47)) \times (DV) \times (C48)]/(I)$$

where:
TSS=Soft-start time period
G46=Gain of transistor 46
G47=Gain of transistor 47
C48=capacitance of capacitor 48
I=current provided by current source 54 and
DV=total change in voltage at output 39 during the soft-start period.

Typically, a soft-start period of one to fifteen milliseconds is desirable in many applications for switch mode power supplies. In one example, a two milli-second soft-start period was provided by utilizing a twelve pico-farad (12 pf) capacitor, a 0.12 micro-amp current source, and a pair of transistors having a gain product of two hundred. Other soft-start periods may be obtained by using different values for the elements of capacitor multiplier circuit 45.

Figure 5:
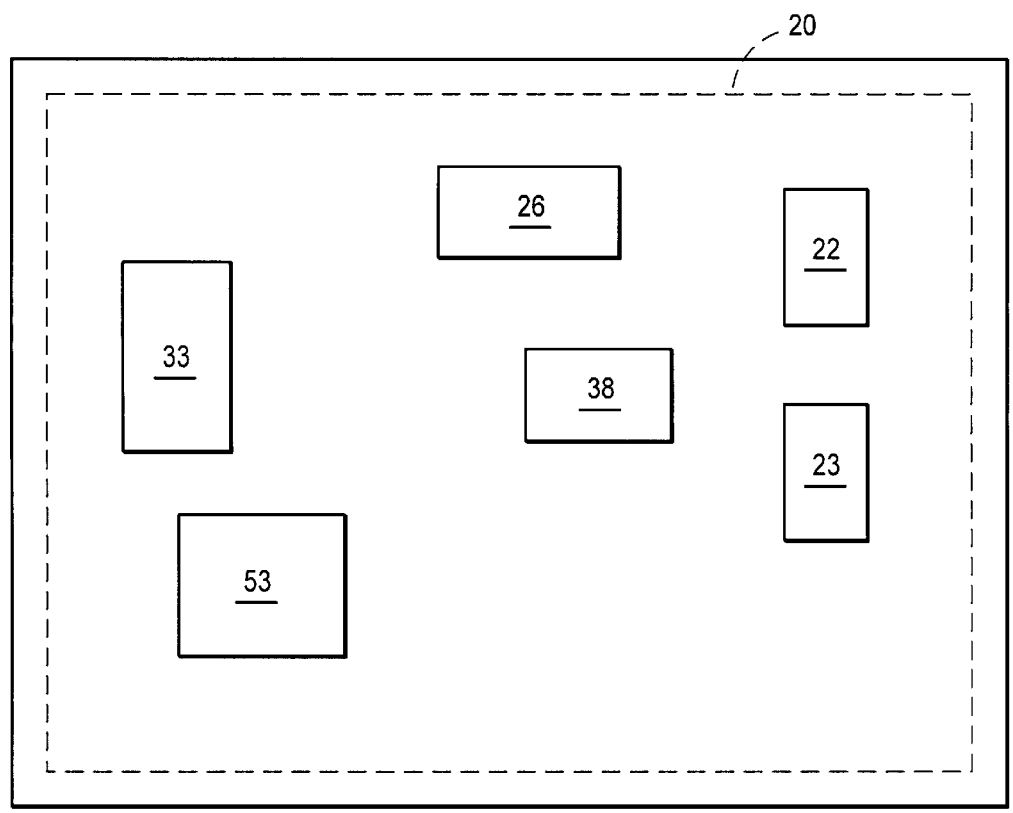
FIG. 5 illustrates an enlarged plan view of a semiconductor die on which a switching device is formed in accordance with the present invention.

FIG. 5 illustrates an enlarged plan view of an embodiment of a semiconductor die 90 on which switching device 20 is formed.

By now it should be appreciated that there has been provided a novel way to form a switching device that minimizes stress and other damage to the high-power device and load devices connected thereto. Using a capacitor multiplier circuit facilitates forming the switching device and the timing circuit on the same semiconductor die. Isolating the timing circuit from the reference voltage facilitates using a controlled voltage reference that has a different value than the voltage forming the timing section and facilitates forming a controlled voltage value that is not loaded by other circuits.

While the invention is described with specific preferred embodiments, it is evident that many alternatives and variations will be apparent to those skilled in the semiconductor arts. More specifically the invention has been described for a particular switching device although the method and structure are applicable to other switching devices such as DC—DC Converters, and other switching pulse systems. Also the invention has been described for a particular MOS transistor structure, although the method is directly applicable to bipolar, HFET, as well as to metal semiconductor FETs (MESFETs) and other transistor structures and combinations thereof.

What is claimed is:

1. A method of forming a switching device comprising:
   forming a timing section having an output cooperatively coupled to an input of an isolation section by forming the timing section and the isolation section on a semiconductor die;
   forming the timing section to generate a first output voltage having a first waveform varying, responsively to a reset input, from a first voltage value to a second voltage value during a time period and varying to a value greater than the second voltage value after the time period; and
   forming the isolation section to cooperatively respond to the first output voltage to generate a second output voltage having a second waveform that varies from a third voltage value to a fourth voltage value during the time period, and formed to decouple the second output voltage from following the first output voltage at an end of the time period wherein the second waveform has a shape during the time period that is approximately equal to a shape of the first waveform.

2. The method of claim 1 further including forming the isolation section to generate the third voltage value and the fourth voltage value to be no greater than the second voltage value.

3. The method of claim 1 wherein forming the isolation section to generate the second output voltage includes coupling, responsively to the first waveform an output of a voltage reference to an output of the isolation section and further including forming the voltage reference to generate on the output of the voltage reference a voltage value approximately equal to the fourth voltage value.

4. The method of claim 1 further including forming the timing section and the isolation section to generate the first voltage value and the third voltage value at approximately a first time and to generate the second voltage value and the fourth voltage value at approximately a second time.

5. The method of claim 1 wherein forming the timing section to generate the first output voltage having the first waveform varying, responsively to the reset input, from the first voltage value includes forming the timing section to delay after the reset input then generate the first voltage value.

6. The method of claim 1 wherein forming the timing section includes forming a capacitor multiplier circuit to multiply a value of a capacitor formed on the semiconductor die with the timing section.

7. The method of claim 1 further including forming the timing section and the isolation section together on a semiconductor die with a portion of a switch mode power supply circuit.

8. The method of claim 1 wherein forming the timing section includes forming a capacitor on the semiconductor die with the timing section.

9. A method of forming a switching device comprising:
   forming a capacitor multiplier circuit on a semiconductor die;
   cooperatively coupling an output of the capacitor multiplier circuit to a control input of an isolation transistor of an isolation circuit; and
   forming the isolation circuit to generate an output voltage responsive to the output of the capacitor multiplier circuit during a time period, and to decouple the output of the isolation circuit from variations of the output of the capacitor multiplier circuit after the time period.

10. The method of claim 9 wherein forming the capacitor multiplier circuit includes forming the capacitor multiplier circuit to generate a first voltage having a first waveform that varies from a first value to a second value during the time period.

11. The method of claim 9 wherein forming the capacitor multiplier circuit includes forming a capacitor on the semiconductor die.

12. The method of claim 9 further including:
   forming an internal voltage supply to generate an internal voltage value;
   coupling a constant current source in series between the internal voltage supply and a first branch of the capacitor multiplier circuit;
   coupling a switch transistor in series between the internal voltage supply and a second branch of the capacitor multiplier circuit wherein the switch transistor is responsively coupled to a reset input;
   forming a voltage reference of the isolation circuit to couple a reference voltage to the isolation transistor by forming the voltage reference in series between the internal voltage supply and a first current electrode of the isolation transistor, and to generate the reference voltage to have a value that is less than the internal voltage value; and
   coupling a second current electrode of the isolation transistor to a power return and to an output of the isolation circuit.

13. The method of claim 12 further including coupling the output of the isolation circuit to an input of a clamped voltage reference.

14. A switching device structure comprising:
   a capacitor multiplier circuit formed on a semiconductor die, the capacitor multiplier circuit having a first branch and a second branch, and an output;
   an internal voltage node;
   a constant current source coupled in series between the internal voltage node and the first branch of the capacitor multiplier circuit;
   a switch transistor coupled in series between the internal voltage node and the second branch of the capacitor multiplier circuit;
   a voltage reference having an input coupled to the internal voltage node, and an output; and
   an isolation transistor having a first current carrying electrode coupled to the output of the voltage reference, a control electrode coupled to the output of the capacitor multiplier circuit, and a second current carrying electrode coupled to a power return.

15. The switching device structure of claim 14 further including a capacitor formed on the semiconductor die and having a first terminal coupled to the first branch of the capacitor multiplier circuit and a second terminal coupled to the second branch of the capacitor multiplier circuit.

16. The switching device structure of claim 14 wherein the capacitor multiplier circuit includes a transistor having a first current carrying electrode coupled to the constant current source, a control electrode coupled to the switch transistor, and a second current carrying electrode coupled to a power return.

17. The switching device structure of claim 14 wherein the capacitor multiplier circuit includes a transistor having a first current carrying electrode coupled to the switch transistor, a control electrode coupled to the first current carrying electrode, and a second current carrying electrode coupled to a power return.

18. The switching device structure of claim 14 further including an adjust transistor coupled between the power return and the first branch and the second branch of the capacitor multiplier circuit.

19. The switching device structure of claim 14 further including a controlled reference having a first input coupled to the second current carrying electrode of the isolation transistor.

20. The switching device structure of claim 14 wherein the voltage reference is formed to generate a voltage that is less than a voltage applied to the internal voltage node.

* * * * *

UNITED STATES PATENT AND TRADEMARK OFFICE
CERTIFICATE OF CORRECTION

PATENT NO. : 6,633,193 B1 Page 1 of 1
DATED : October 14, 2003
INVENTOR(S) : Josef Halamik and Frantisek Sukup It is certified that error appears in the above-identified patent and that said Letters Patent is hereby corrected as shown below:

Title page,
Item [73], Assignee, should read -- Semiconductor Components Industries, L.L.C., Phoenix, AZ (US) --

Signed and Sealed this

Twenty-first Day of September, 2004

JON W. DUDAS
*Director of the United States Patent and Trademark Office*